(12) United States Patent
Kadu

(10) Patent No.: US 12,348,600 B2
(45) Date of Patent: Jul. 1, 2025

(54) SYSTEM AND METHOD FOR DYNAMIC ENTROPY CODING

(71) Applicant: Samsung Display Co., Ltd., Yongin-si (KR)

(72) Inventor: Harshad Kadu, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 345 days.

(21) Appl. No.: 17/971,344

(22) Filed: Oct. 21, 2022

(65) Prior Publication Data

US 2024/0048641 A1 Feb. 8, 2024

Related U.S. Application Data

(60) Provisional application No. 63/395,780, filed on Aug. 5, 2022.

(51) Int. Cl.
*H04L 69/04* (2022.01)
*H03M 7/42* (2006.01)

(52) U.S. Cl.
CPC ............ *H04L 69/04* (2013.01); *H03M 7/42* (2013.01)

(58) Field of Classification Search
None
See application file for complete search history.

(56) References Cited

U.S. PATENT DOCUMENTS

| | | | |
|---|---|---|---|
| 5,764,374 A | 6/1998 | Seroussi et al. | |
| 5,778,102 A * | 7/1998 | Sandford, II | ....... H04N 19/61 375/E7.267 |
| 5,970,098 A * | 10/1999 | Herzberg | ............ H04L 1/0069 375/264 |
| 6,026,198 A | 2/2000 | Okada | |
| 7,233,266 B2 | 6/2007 | Sasakura | |
| 8,160,137 B2 | 4/2012 | Ho et al. | |

(Continued)

FOREIGN PATENT DOCUMENTS

| | | |
|---|---|---|
| EP | 0789326 A2 | 8/1997 |
| JP | 2006-033508 A | 2/2006 |
| WO | WO 2012/023061 A1 | 2/2012 |

OTHER PUBLICATIONS

European Search Report for EP Application No. 23186703.7 dated Nov. 28, 2023, 8 pages.

*Primary Examiner* — Darryl V Dottin
(74) *Attorney, Agent, or Firm* — Lewis Roca Rothgerber Christie LLP

(57) ABSTRACT

A system and a method are disclosed for encoding data for transmission, including determining a rank of a first obtained symbol of the plurality of symbols, encoding, at an encoder, the rank of the first symbol, generating a new frequency entry for the first obtained symbol by incrementing an initial histogram frequency entry of the first obtained symbol, determining, based on the new frequency entry of the first obtained symbol, that the rank of the first obtained symbol of the plurality of symbols has a constraint violation with a rank of a first violating symbol in the first encoder LUT, swapping the rank of the first obtained symbol and the rank of the first violating symbol in the first encoder LUT so the constraint violation is resolved, and generating a compressed bit-stream by iteratively applying an encoding function to each symbol of the plurality of symbols.

20 Claims, 6 Drawing Sheets

(56) References Cited

U.S. PATENT DOCUMENTS

| | | |
|---|---|---|
| 8,576,097 B2 | 11/2013 | Ugur et al. |
| 10,027,346 B2 | 7/2018 | Henry |
| 10,452,616 B1 | 10/2019 | Bassov et al. |
| 10,469,102 B2 | 11/2019 | Park et al. |
| 11,226,740 B2 | 1/2022 | Shabi et al. |
| 2003/0058958 A1* | 3/2003 | Shokrollahi ......... H04L 1/0041 375/295 |
| 2005/0254707 A1 | 11/2005 | Takahashi |
| 2021/0125319 A1 | 4/2021 | Douady et al. |
| 2021/0209719 A1 | 7/2021 | Mody et al. |

* cited by examiner

SYSTEM AND METHOD FOR DYNAMIC ENTROPY CODING

CROSS-REFERENCE TO RELATED APPLICATION

This application claims the priority benefit under 35 U.S.C. § 119(e) of U.S. Provisional Application No. 63/395,780, filed on Aug. 5, 2022, the disclosure of which is incorporated by reference in its entirety as if fully set forth herein.

TECHNICAL FIELD

The disclosure generally relates to data compression. More particularly, the subject matter disclosed herein relates to dynamic entropy coding techniques.

BACKGROUND

The background of the presently disclosed techniques are described herein in the context of data compression and dynamic entropy coding, however, the techniques are by no means limited thereto except as expressly set forth in the accompanying claims. This background is intended to orient readers to sufficiently understand the concepts presented in more detail below—therefore, this background may contain or describe material discovered by, or known only to the inventors, and should not be considered as prior art.

Digital image transmission combined with data compression techniques may be employed to maximize the amount of information that can be transmitted. A signal can be perceived as a combination of symbols. For example, an 8-bit image is made up of pixels that may have values from 0 to 255. In other words, an 8-bit image is any combination of these 256 symbols. During compression, a symbol is replaced by its binary code. Shorter binary codes may be assigned to more probable symbols and less probable symbols may have longer binary codes. Conventional non-uniform probability distribution of symbols are exploited during entropy coding. For example, static mapping of symbols to binary codes assumes that the probability distribution of symbols in the image is known beforehand. A static method is very inefficient when the image statistics do not match well with these assumptions, leading to higher compressed file sizes. Since present dynamic entropy coding techniques change the binary code itself, alternative solutions are needed to resolve the computational intensity of the process.

SUMMARY

Disclosed herein are systems and methods intended to address the shortcomings in the art and may provide additional or alternative advantages as well.

(A1) In one embodiment, a method for encoding data for transmission from a source to a destination over a communication channel is disclosed. The method is being performed by at least one processor and comprises or includes: a) obtaining a symbol stream comprising a plurality of symbols, b) determining a rank of a first obtained symbol of the plurality of symbols from a first encoder look-up table (LUT), c) encoding, at an encoder, the rank of the first symbol, d) generating a new frequency entry for the first obtained symbol by incrementing an initial histogram frequency entry of the first obtained symbol after encoding the rank of the first obtained symbol, e) determining, based on the new frequency entry of the first obtained symbol, that the rank of the first obtained symbol of the plurality of symbols has a constraint violation with a rank of a first violating symbol in the first encoder LUT, f) swapping the rank of the first obtained symbol and the rank of the first violating symbol in the first encoder LUT so the constraint violation is resolved and g) generating a compressed bit-stream by iteratively applying an encoding function to each symbol of the plurality of symbols.

(A2) The method of (A1) further comprises, updating, a corresponding second encoder LUT for the first obtained symbol and first violating symbol, wherein the first encoder LUT is a symbol to rank LUT and wherein the second encoder LUT is a rank to symbol LUT.

(A3) The method of (A1) wherein: swapping the rank of the first obtained symbol and first violating symbol in the first encoder LUT and updating the corresponding second encoder LUT entries for the first obtained symbol and first violating symbol occurs without any additional data shared between the encoder and corresponding decoder, and wherein the first encoder LUT and second encoder LUT at the encoder are distinct from and also synchronized with the first decoder LUT and second decoder LUT at a corresponding decoder.

(A4) The method of (A1), wherein when the constraint violation is not present: skipping any updates to the first encoder LUT and second encoder LUT for the first obtained symbol and the violating symbol and applying the encoding function to the second obtained symbol of the plurality of symbols.

(A5) The method of (A4), wherein iteratively applying the encoding function to each symbol of the plurality of symbols includes: a) determining a rank of the second obtained symbol of the plurality of symbols, b) encoding, at an encoder, the rank of the second obtained symbol of the plurality of symbols, c) generating a histogram frequency entry by incrementing a histogram frequency entry of the second obtained symbol after encoding the rank of the second obtained symbol, d) determining, based on the new frequency entry of the second obtained symbol, that the rank of the second symbol in the first encoder LUT has a constraint violation with a rank of a second violating symbol in the first encoder LUT of the plurality of symbols; and e) swapping the rank of the second obtained symbol of the plurality of symbols and the rank of the second violating symbol in the first encoder LUT so the constraint violation is resolved.

(A6) The method of (A1), wherein a constraint violation occurs if a symbol, $s_i$ of the plurality of symbols has a higher frequency than another symbol, $s_1$ in the histogram, but a larger rank in first encoder LUT, such that, the constraint violation is defined as: $H(s_1) < H(s_i)$ but $rank(s_i) > rank(s_1)$.

(A7) The method of (A1), wherein encoding the rank of the first obtained symbol is determined by generating an associated binary code for the rank of the first obtained symbol.

(A8) The method of (A1), wherein a histogram frequency entry of each symbol of the plurality of symbols represents the number of occurrences of that symbol in the symbol stream compressed so far.

(A9) The method of (A1), wherein the first encoder LUT is initialized using the frequency distribution defined in the histogram.

(A10) The method of (A1), wherein the first encoder LUT maps each symbol of the plurality of symbols to their rank and wherein a symbol associated with a higher frequency in the histogram receives a smaller rank and a symbol associated with a lower frequency in the histogram receives a larger rank.

(A11) The method of (A1), wherein the second encoder LUT is initialized from the first encoder LUT.

(B1) A method of dynamically decoding a sequence of bits, the method comprising: a) obtaining a first sequence of bits of a compressed bit-stream, b) decoding a first obtained symbol from a first binary code from the sequence of bits, c) incrementing a histogram frequency entry of the first obtained symbol after decoding the first obtained symbol, d) determining, based on the new frequency entry of the first obtained symbol, that the rank of the first obtained symbol of the plurality of symbols has a constraint violation with a rank of a first violating symbol in the first decoder LUT, e) swapping the rank of the first obtained symbol and the rank of the first violating symbol in the first decoder LUT so the constraint violation is resolved; f) generating a symbol stream by iteratively applying a decoding function to each binary code from the sequence of bits.

(B2) The method of (B1), further includes: updating a corresponding second LUT for the first obtained symbol and first violating symbol, wherein the first LUT is a symbol to rank LUT and wherein the second LUT is a rank to symbol LUT.

(B3) The method of (B1), in which swapping the rank of the first obtained symbol and first violating symbol in the first decoder LUT and updating the corresponding second decoder LUT entries for the first obtained symbol and first violating symbol occurs without any additional data shared between the decoder and corresponding encoder, and wherein the first decoder LUT and second decoder LUT at the decoder are distinct from and also synchronized with the first encoder LUT and second encoder LUT at a corresponding encoder.

(B4) The method of (B1), in which when the constraint violation is not present: skipping any updates to the first decoder LUT and second decoder LUT for the first obtained symbol and the violating symbol and applying the decoding function to the second obtained symbol of the plurality of symbols.

(B5) The method of (B1), in which iteratively applying the decoding function to each binary code from the sequence of bits includes: decoding a second obtained symbol from a second binary code from the sequence of bits, incrementing a histogram frequency entry of the second obtained symbol after decoding the second obtained symbol, determining, based on the new frequency entry of the second obtained symbol, that the rank of the second obtained symbol of the plurality of symbols has a constraint violation with a rank of a second violating symbol in the first decoder LUT and swapping the rank of the second obtained symbol and the rank of the second violating symbol in the first decoder LUT so the constraint violation is resolved.

(B6) The method of (B1), in which a constraint violation occurs if a symbol, $s_i$ of the plurality of symbols has a higher frequency than another symbol, $s_1$ in the histogram, but a larger rank in first LUT, such that, the constraint violation is defined as: $H(s_1)<H(s_i)$ but $rank(s_i)>rank(s_1)$.

(B7) The method of (B1), in which a histogram frequency entry of each symbol represents the number of occurrences of that symbol in the bit stream decompressed so far.

(C1) An apparatus for selectively attaching a compressed transform representative data structure, to image data input to said image processing device, comprising: selecting at least one of the compressed transform representative data structures, wherein each compressed transform representative data structure includes a first encoder look-up table (LUT) and second encoder LUT, wherein updating a first encoder look-up table (LUT) and a second encoder LUT in real-time includes: a) obtaining a symbol stream comprising a plurality of symbols, b) determining a rank of a first obtained symbol of the plurality of symbols from a first encoder look-up table (LUT), c) encoding, at an encoder, the rank of the first symbol, d) generating a new frequency entry for the first obtained symbol by incrementing an initial histogram frequency entry of a first symbol after encoding a rank of the first obtained symbol, e) determining, based on the new frequency entry of the first obtained symbol, that the rank of the first obtained symbol of the plurality of symbols has a constraint violation with a rank of a first violating symbol in the first encoder LUT, f) swapping the rank of the first obtained symbol and the rank of the first violating symbol in the first encoder LUT so the constraint violation is resolved and g) generating a compressed bit-stream by iteratively applying an encoding function to each symbol of the plurality of symbols.

(D1) An apparatus for selectively attaching a compressed transform representative data structure, to image data input to said image processing device, may include: selecting at least one of the compressed transform representative data structures, wherein each compressed transform representative data structure includes a first decoder look-up table (LUT) and second decoder LUT, wherein updating a first decoder look-up table (LUT) and a second decoder LUT in real-time includes: obtaining a first sequence of bits of a compressed bit-stream; a) decoding a first obtained symbol from a first binary code from the sequence of bits, incrementing a histogram frequency entry of the first obtained symbol after decoding the first obtained symbol, determining, based on the new frequency entry of the first obtained symbol, that the rank of the first obtained symbol of the plurality of symbols has a constraint violation with a rank of a first violating symbol in the first decoder LUT, swapping the rank of the first obtained symbol and the rank of the first violating symbol in the first decoder LUT so the constraint violation is resolved; and generating a symbol stream by iteratively applying a decoding function to each binary code from the sequence of bits.

(E1) A computer-readable medium that is non-transitory for use with electronics capable of executing instructions read from the computer-readable medium in order to implement encoding data for transmission from a source to a destination over a communications channel, the computer-readable medium having stored thereon: a) program code for obtaining a symbol stream comprising a plurality of symbols, b) program code for determining a rank of a first obtained symbol of the plurality of symbols from a first encoder look-up table (LUT), c) program code for encoding, at an encoder, the rank of the first symbols, d) program code for generating a new frequency entry for the first obtained symbol by incrementing an initial histogram frequency entry of a first symbol after encoding a rank of the first obtained symbol, e) program code for determining, based on the new frequency entry of the first obtained symbol, that the rank of the first obtained symbol of the plurality of symbols has a constraint violation with a rank of a first violating symbol in the first encoder LUT, f) program code for swapping the rank of the first obtained symbol and the rank of the first violating symbol in the first encoder LUT so the constraint violation is resolved; and g) program code for generating a compressed bit-stream by iteratively applying an encoding function to each symbol of the plurality of symbols.

(F1) A computer-readable medium that is non-transitory for use with electronics capable of executing instructions read from the computer-readable medium in order to implement decoding output symbols transmitted over a communications channel wherein the output symbols represent data sent by one or more transmitters, the computer-readable medium having stored thereon a) program code for obtaining a first sequence of bits of a compressed bit-stream; b) program code for decoding a first obtained symbol from a first binary code from the sequence of bits, c) program code for incrementing a histogram frequency entry of the first obtained symbol after decoding the first obtained symbol, d) program code for determining, based on the new frequency entry of the first obtained symbol, that the rank of the first obtained symbol of the plurality of symbols has a constraint violation with a rank of a first violating symbol in the first decoder LUT, e) program code for swapping the rank of the first obtained symbol and the rank of the first violating symbol in the first decoder LUT so the constraint violation is resolved; and f) program code for generating a symbol stream by iteratively applying a decoding function to each binary code from the sequence of bits.

(G1) A decoder for decoding output symbols transmitted over a communications channel, the decoder comprising: a) obtaining a first sequence of bits of a compressed bit-stream, b) decoding a first obtained symbol from a first binary code from the sequence of bits, c) incrementing a histogram frequency entry of the first obtained symbol after decoding the first obtained symbol, d) determining, based on the new frequency entry of the first obtained symbol, that the rank of the first obtained symbol of the plurality of symbols has a constraint violation with a rank of a first violating symbol in the first decoder LUT, e) swapping the rank of the first obtained symbol and the rank of the first violating symbol in the first decoder LUT so the constraint violation is resolved; and f) generating a symbol stream by iteratively applying a decoding function to each binary code from the sequence of bits.

(H1) An encoder for encoding data for transmission from a source to a destination over a communications channel, the encoder comprising: a) obtaining a symbol stream comprising a plurality of symbols, b) determining a rank of a first obtained symbol of the plurality of symbols from a first encoder look-up table (LUT), c) encoding, at an encoder, the rank of the first symbol, d) generating a new frequency entry for the first obtained symbol by incrementing an initial histogram frequency entry of a first symbol after encoding a rank of the first obtained symbol, e) determining, based on the new frequency entry of the first obtained symbol, that the rank of the first obtained symbol of the plurality of symbols has a constraint violation with a rank of a first violating symbol in the first encoder LUT, f) swapping the rank of the first obtained symbol and the rank of the first violating symbol in the first encoder LUT so the constraint violation is resolved and g) generating a compressed bit-stream by iteratively applying an encoding function to each symbol of the plurality of symbols.

BRIEF DESCRIPTION OF THE DRAWING

In the following section, the aspects of the subject matter disclosed herein will be described with reference to exemplary embodiments illustrated in the figures, in which.

DETAILED DESCRIPTION

Figure 1:
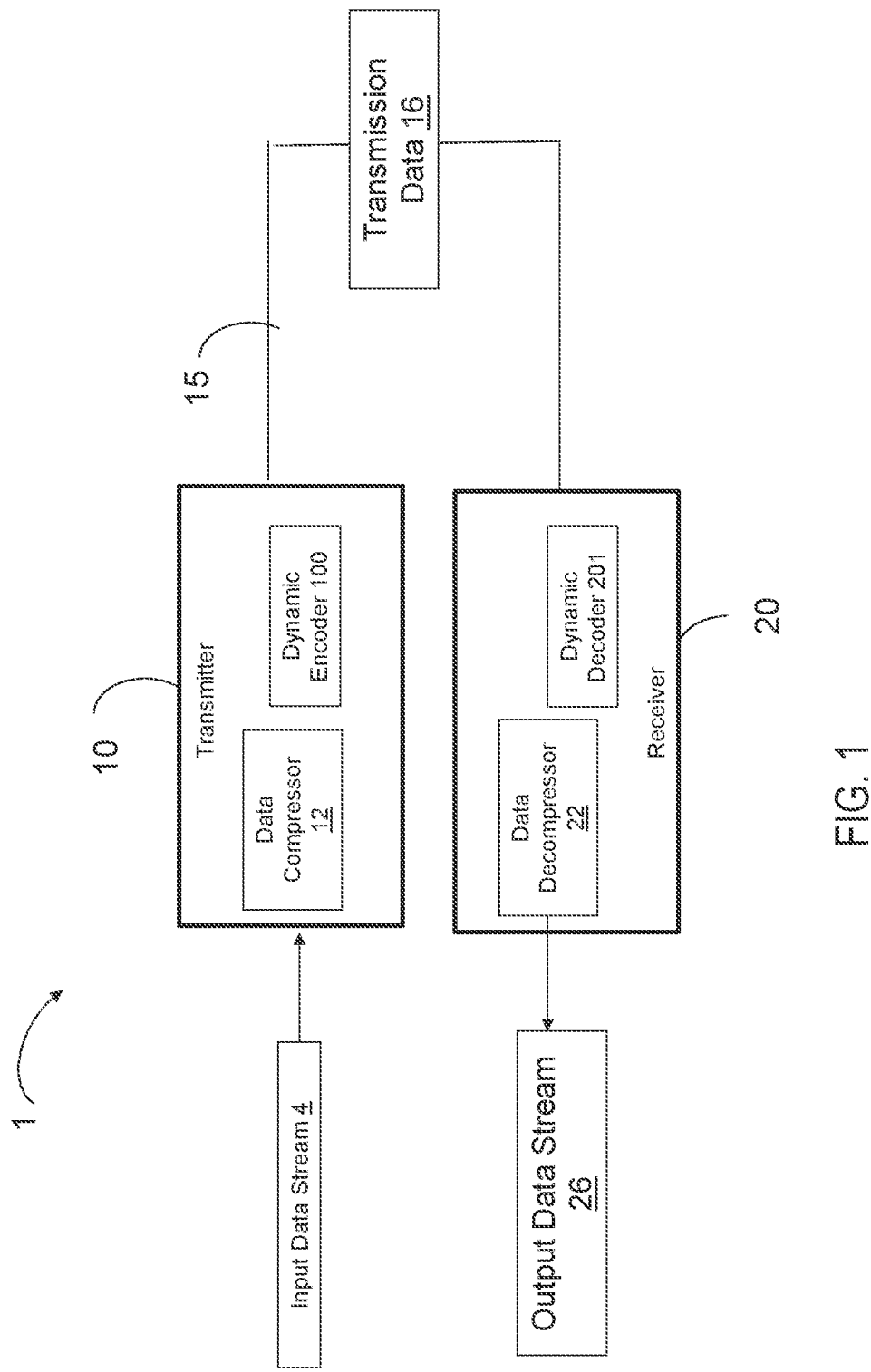
FIG. 1 is a block diagram of a dynamic entropy coding system, according to one or more embodiments of the present disclosure.

In order to overcome these issues identified in the Background, and others, systems and methods are described herein for a two-stage mapping from symbols to binary codes. In the first stage of mapping, symbols are mapped to ranks and in the second stage, ranks are mapped to binary codes. Ranking is an extra layer of abstraction introduced. Mapping symbols to ranks is a dynamic process. These ranks are then mapped to binary codes. The ranks to binary codes mapping is static.

The above approach improves on previous methods because it is much faster and less complex than adaptive entropy coding techniques. The mapping from symbols to ranks is dynamic, so the proposed method is more optimal in compressing symbols than static Huffman or static Arithmetic Coding. Further, as will be explained in greater detail in reference to FIG. 3, the encoder and decoder are synchronized (i.e., since they are in sync with each other, they update their mappings independently and identically without the need to share any data between them). The proposed method can work with any image, i.e. natural or synthetic, and works particularly well with natural images.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," etc.) may be occasionally interchangeably used with a corresponding non-hyphenated version (e.g., "two dimensional," "predetermined," "pixel specific," etc.), and a capitalized entry (e.g., "Counter Clock," "Row Select," etc.) may be interchangeably used with a corresponding non-capitalized version (e.g., "counter clock," "row select," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

"Rank" as used herein refers to the relative position of the symbol with respect to the other symbols in terms of their frequencies. A symbol $s_i$ with a higher frequency than symbol $s_j$ gets a smaller rank, such that: freq($s_i$)>freq($s_j$) then rank($s_i$)<rank($s_j$). "Frequency" as used herein refers to the number of occurrences of a certain symbol in the symbols compressed so far. For example, in the list of symbols: $s_1$, $s_1$, $s_2$, $s_3$, $s_2$, the frequency of $s_1$ and $s_2$ is 2, while the frequency of $s_3$ is 1. In other embodiments, a symbol can have a frequency expressed as a percentage, ratio, or decimal based on the number of times a symbol has occurred compared to the total number of symbol occurrences. For example, if symbol $s_i$ has a frequency of 60%, and symbol $s_j$ has a frequency of 20%, then symbol $s_i$ gets a smaller rank than symbol $s_j$. As such, the frequency of a symbol can be expressed as an absolute number (e.g., a frequency of 2) or as a ratio (e.g., a symbol can have a frequency of occurrence of 2/10 or 20%). Herein below, embodiments may be described using absolute numerical frequencies, but one will readily recognize that alternative embodiments may use percentage/ratio based frequencies are readily utilized without departing from the general concepts disclosed herein The first encoder LUT as used herein refers to a symbol-to-rank LUT. An example of a symbol-to-rank LUT is shown in table 1 below. The symbol-to-rank LUT will be referred to herein as: $L_{s2r}$.

The second encoder LUT as used herein refers to a rank-to-symbol LUT. An example of a rank-to-symbol LUT is shown in table 2 below. The rank-to-symbol LUT will be referred to herein as: $L_{r2s}$.

"Dynamic ranking" as used herein refers to the changing of ranks of a set of symbols after each symbol is processed.

FIG. 1 is a block diagram of a dynamic entropy coding system, according to one or more embodiments of the present disclosure. Referring to FIG. 1, in some embodiments, the data communication system 1 may include input data stream 4, a transmitter 10, a communication channel 15, transmission data 16, receiver 20 and output data stream 26. The transmitter 10 may include, at least, a data compressor 12 for performing compression on the input data stream 4 and a dynamic encoder 100 for encoding the input data stream 4 to generate transmission data 16 for transmission through the communication channel 15 to the receiver 20. The receiver 20 may include, at least, a data decoder 22 performing decompression on the data stream received by the receiver 20 and a dynamic decoder 201 for decoding the data stream to generate the output data stream 26. The details of the dynamic encoding and decoding will be described in more detail in the description for FIG. 3.

Figure 2:
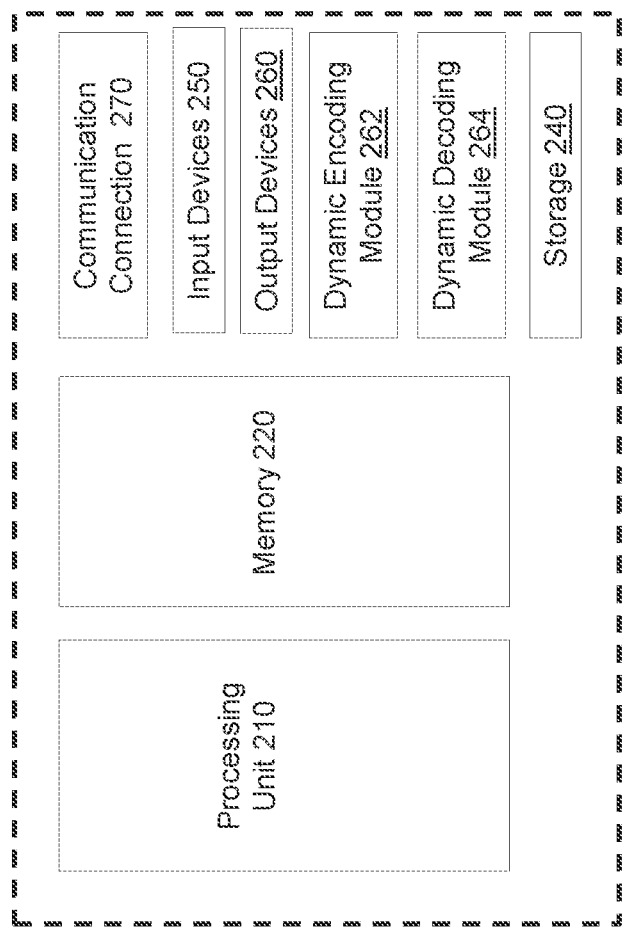
FIG. 2 is a block diagram of a suitable computing environment in which described embodiments may be implemented, according to one or more embodiments of the present disclosure.

FIG. 2 illustrates a generalized example of a suitable computing environment 200 in which described embodiments of the dynamic entropy coding system may be implemented. The computing environment 200 is not intended to suggest any limitation as to scope of use or functionality of the invention, as the present invention may be implemented in diverse general-purpose or special-purpose computing environments.

The computing environment 200 may include at least one processing unit 210 and memory 220. The processing unit 210 executes computer-executable instructions and may be a real or a virtual processor. In a multi-processing system, multiple processing units execute computer-executable instructions to increase processing power. The memory 220 may be volatile memory (e.g., registers, cache, RAM), non-volatile memory (e.g., ROM, EEPROM, flash memory, etc.), or some combination of the two. In some embodiments, the memory 220 stores software 280 implementing dynamic encoder and decoder mapping. The memory 220 may have stored thereon instructions that, when executed by the processor 210, cause the processor 210 to perform the operations described herein with respect to FIGS. 2-5.

Typically, operating system software (not shown) provides an operating environment for other software executing in the computing environment 200, and coordinates activities of the components of the computing environment 200.

A computing environment may have additional features. For example, the computing environment 200 includes storage 240, one or more input devices 250, one or more output devices 260, dynamic encoding module 262, dynamic decoding module 264 and one or more communication connections 270. An interconnection mechanism (not shown) such as a bus, controller, or network interconnects the components of the computing environment 200.

The storage 240 may be removable or non-removable, and includes magnetic disks, magnetic tapes or cassettes, CD-ROMs, CD-RWs, DVDs, or any other medium which can be used to store information and which can be accessed within the computing environment 200. The storage 240 stores instructions for the software 280 implementing dynamic encoder and decoder mapping.

The input device(s) 250 may be a touch input device such as a keyboard, mouse, pen, or trackball, a voice input device, a scanning device, sound card, TV tuner/video input card, or other device that provides input to the computing environment 200.

The output device(s) 260 may be a visual display unit, printer, speaker, CD-writer, or other device that provides output from the computing environment 200. A visual display unit presents screen content based upon output delivered.

The dynamic encoding module 262 may allow data for transmission from a source to a destination over communication channel to be encoded in real-time, using a two-stage dynamic method that generates distinct synchronized look-up tables.

The dynamic decoding module 264 may allow data for transmission from a source to a destination over communication channel to be decoded, in real-time, using a two-stage dynamic method that generates distinct synchronized look-up tables.

The communication connection(s) 270 enable communication over a communication medium to another computing entity. The communication medium conveys information such as computer-executable instructions, compressed information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The invention can be described in the general context of computer-readable media. Computer-readable media are any available media that can be accessed within a computing environment. By way of example, and not limitation, with the computing environment 200, computer-readable media include memory 220, storage 240, communication media, and combinations of any of the above.

The invention can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various implementations. Computer-executable instructions for program modules may be executed within a local or distributed computing environment.

For the sake of presentation, the detailed description uses terms like "detect," "select," "encode," and "decode" to describe computer operations in a computing environment. These terms are high-level abstractions for operations performed by a computer, and should not be confused with acts performed by a human being. The actual computer operations corresponding to these terms vary depending on implementation.

Figure 3:
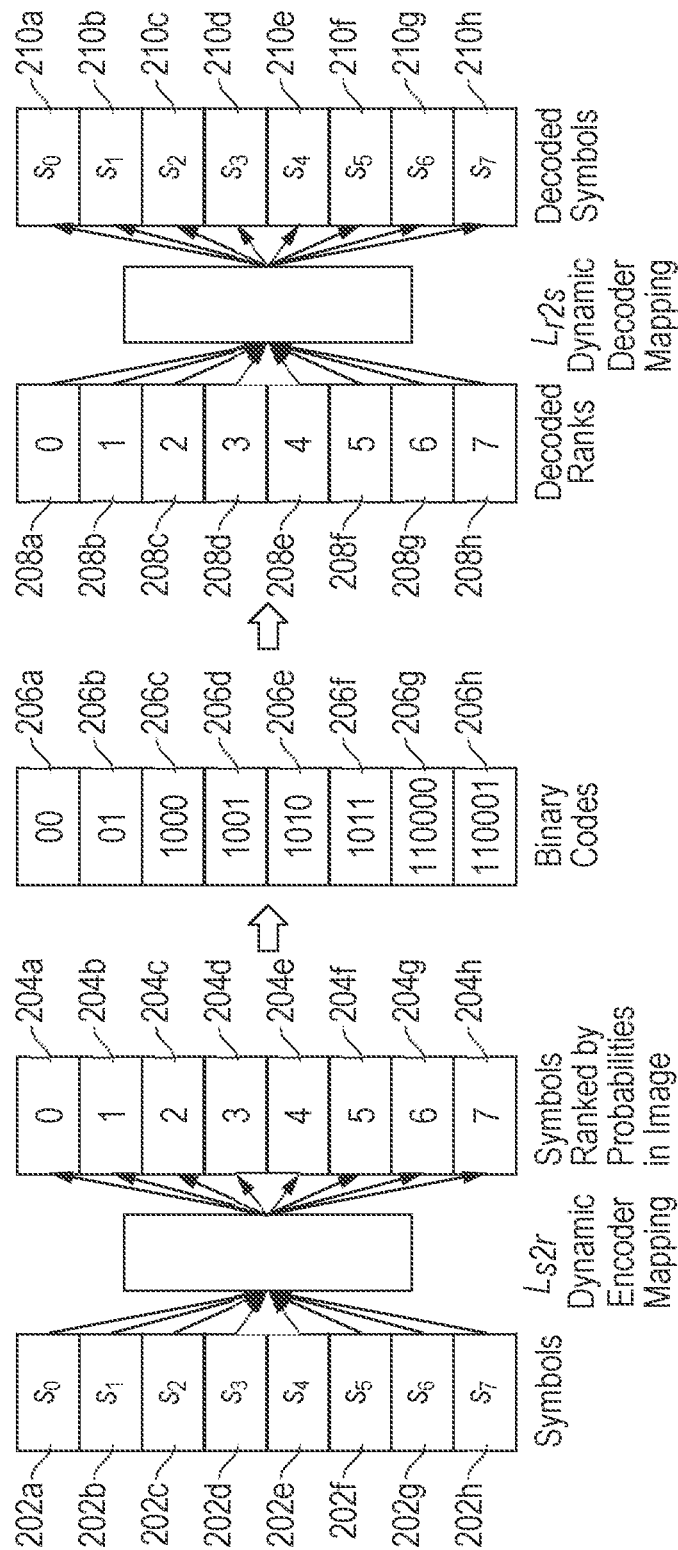
FIG. 3 is a diagram of the dynamic symbol compression method, according to an exemplary embodiment.

FIG. 3 is a diagram of the proposed dynamic symbol compression method, in accordance with some embodiments. The dynamic symbol compression method ranks symbols by probabilities in the symbol stream compressed so far. Offering a method that accounts for real-time compression of the symbol stream, allows for efficient data compression with dynamic mapping of symbols to binary codes through ranks, using fewer computational resources than adaptive entropy coding methods. An important aspect of the disclosed dynamic symbol encoding and decoding method, device and system is the two-stage mapping process.

The first stage of the dynamic encoding, as will be described in greater detail, is the symbol to rank mapping. As symbols (e.g., of a received symbol stream) $202a$-$202h$ are ranked to rankings $204a$-$204h$, the rankings $204a$-$204h$ are based on actual probability of occurrence of a symbol in the symbol stream compressed so far. For example, first symbol $202a$, $s_0$, may receive a first ranking $204a$ of 0 based on its highest frequency of occurrence in the symbol stream compressed so far whereas eighth symbol $s_7$ may receive a ranking of 7 based on its lowest frequency of occurrence in the symbol stream compressed so far. This first stage of mapping from symbols $202a$-$202h$ to ranks $204a$-$204h$ may be seen as "dynamic" since no prior knowledge of the probability distribution of symbols is assumed: the probability distribution is learned "on-the-fly".

The second stage of the dynamic encoding is the mapping of ranks to binary codes. As shown in FIG. 3, rankings $204a$-$204h$ are mapped to binary codes $206a$-$206h$. Rankings $204a$-$204h$ may be seen as an extra layer of abstraction introduced. As symbols $202a$-$202h$ are ranked to ranking $204a$-$204h$ based on frequency of occurrence of these symbols in the symbol stream compressed so far, rankings are then mapped to binary codes $206a$-$206h$.

At the decoder side, a similar two-stage mapping process is initiated. The decoder receives a sequence of bits made up of binary codes $206a$-$206h$ and decodes them into decoded ranks $208a$-$208h$. The decoded ranks $208a$-$208h$ are then mapped to their decoded symbols $210a$-$210h$. The details of this two-stage dynamic coding will be discussed now.

A. Histogram and Look-up Table (LUT) Initialization and Modification

A histogram may be initialized to have an initial frequency for each symbol (e.g., symbols 202a-202h) of the plurality of symbols, wherein an encoder and a decoder are associated with the histogram. A first look-up table (also referred to herein as a symbol to rank look up table or $L_{s2r}$, as shown in Table 1) and a second look-up table (also referred to herein as a rank to symbol LUT or $L_{r2s}$, as shown in Table 2) are initialized from the initial histogram (e.g., see Table 3 below). Examples of the initial $L_{s2r}$, $L_{r2s}$ and the histogram at the encoder side are shown in tables 1-3. Initializing the $L_{s2r}$ requires that the symbol of the plurality of symbols 202a-202h with a higher frequency is assigned a smaller rank (e.g., a rank of 0 in a rank of 0-3) and the symbol of the plurality of symbols 202a-202h with a lower frequency is assigned a larger rank (e.g., a rank of 3 in a rank of 0-3). In some embodiments, the individual symbol ranks are not assigned. Instead, in some embodiments, the individual symbol ranks are determined for each symbol from a search look-up process for each symbol.

The rank of an individual symbol may be defined with a binary code, wherein a smaller rank is represented with a shorter binary code and larger rank is represented by a longer binary code. As such, the encoder and decoder have the same rank to binary code representation. In some embodiments, the $L_{r2s}$ is initialized from the $L_{s2r}$.

The encoder may have a local copy of the $L_{s2r}$ (e.g., as shown in table 1) and $L_{r2s}$ (e.g., as shown in table 2). The $L_{s2r}$, $L_{r2s}$, and histogram at the encoder and the $L_{s2r}$, $L_{r2s}$, and histogram in the decoder each have initial states. The $L_{s2r}$ and $L_{r2s}$ at the encoder and decoder have identical initial states (e.g., frequency distribution) for each symbol. Shorter binary codes are assigned to more probable symbols (sometimes referred to herein as symbols having smaller ranks) and longer binary codes are assigned to less probable symbols (sometimes referred to herein as symbols having larger ranks), as will be expanded upon herein.

B. Encoder Overview

A first simplified exemplary embodiment of the proposed dynamic symbol compression method will be discussed. After receiving a symbol $s_i$, its rank, $r_i$, is determined from the $L_{s2r}$, which can be represented as: $r_i = L_{s2r}(s_i)$. In some embodiments, rank, $r_i$ is generated from the $L_{s2r}$. After determining the rank of a symbol $s_i$, the rank of the first obtained symbol is encoded, based on its associated binary code (e.g., see Table 4). Next, a histogram entry, $H(s_i)$, for the first obtained symbol $s_i$ is incremented. If the ranking of the first obtained symbol $s_i$ violates a descending frequency constraint (also referred to herein as a constraint violation), the next "best ranked" symbol is searched for $s_1 = L_{dec}(L_{enc}(s_i)-j)$, such that $H(s_1) < H(s_i)$ where $j \in [1, L_{s2r}(s_i)]$. Usually the search terminates after one iteration, i.e. j=1, so its complexity is O(1). In some embodiments, the worst case is O(R) with improper initialization, where R is the current rank of the symbol. Next, the ranks for $s_i$ and the symbol violating the constraint (e.g., $s_1$) are updated.

Updating Ranks

Updating ranks also includes swapping ranks for $s_i$ and $s_1$:
Suppose $r_1 = L_{s2r}(s_1)$ is the current rank for $s_1$, then:
$L_{s2r}(s_i) = r_1$ and $L_{s2r}(s_1) = r_i$
$L_{r2s}(r_i) = s_1$ and $L_{r2s}(r_1) = s_i$ A constraint violation occurs if a symbol, $s_i$ of the plurality of symbols has a higher frequency than another symbol, $s_1$ in the histogram, but a larger rank in a $L_{s2r}$, such that the constraint violation is defined as: $H(s_1) < H(s_i)$ but rank$(s_i)$>rank$(s_1)$.

In some embodiments, let us assume that there are only 4 possible source symbols in a symbol stream. These symbols may be represented by: $s_0$, $s_1$, $s_2$ and $s_3$. The $L_{s2r}$ and $L_{r2s}$ may be initialized from the frequency distribution in the initial histogram. The initial LUT ranks and initial histogram are shown in tables 1-3. Please note that Table 4 is just a combination of tables 1-3 for ease of reference. The combined tables are for illustration only, data is not stored in this fashion. Instead, data is stored in respective $L_{s2r}$, $L_{r2s}$ and histogram H, at the encoder and decoder, respectively.

Look-Up Tables $L_{s2r}$ maps symbols to ranks and $L_{r2s}$ maps ranks back to symbols. The encoder and decoder each have local copies of $L_{s2r}$ and $L_{r2s}$. In some embodiments, the $L_{s2r}$ and $L_{r2s}$ at the encoder are distinct from and also synchronized with the $L_{s2r}$ and $L_{r2s}$ at a corresponding decoder. As will be shown, the distinct $L_{s2r}$ and $L_{r2s}$ at the encoder and decoder are initialized using the same process and go through the same changes over time. In other words, $L_{s2r}$ LUTs at the encoder and decoder are identical to each other at specific instances in time. Similarly, $L_{r2s}$ LUTs at the encoder and decoder are identical to each other at the same specific instances in time. These time instances may include (i) before encoding the first obtained symbol (encoder side) and before decoding the first obtained symbol (decoder side), (ii) before encoding second obtained symbol (encoder side) and before decoding second obtained symbol (decoder side), etc. That is to say, the $L_{s2r}$ and $L_{r2s}$ at the encoder and decoder are synchronized as they go through the same transition patterns and emerge identical to each other without data sharing. As there is no need of data sharing for the LUT synchronization, valuable bits are saved and compression efficiency is improved. In other embodiments, the encoder and decoder are not limited to $L_{s2r}$ and $L_{r2s}$, as described herein. In other embodiments, the LUTs may be eliminated altogether in place of an alternative LUT.

TABLE 1 symbol to rank LUT initialization

| Symbols | Rank |
|---------|------|
| $s_0$ | 0 |
| $s_1$ | 1 |
| $s_2$ | 2 |
| $s_3$ | 3 |

TABLE 3

Histogram Initialization

| 0 | 0 | 0 | 0 |
|---|---|---|---|
| $s_0$ | $s_1$ | $s_2$ | $s_3$ |

TABLE 2

Rank to symbol LUT initialization

| Rank | Symbols |
|------|---------|
| 0 | $s_0$ |
| 1 | $s_1$ |
| 2 | $s_2$ |
| 3 | $s_3$ |

As a second example, suppose we have to encode data for transmission from a source to a destination over a communication channel. A processor (e.g., processor unit 210) may perform a process for encoding data. For example, the following symbol stream may be obtained (or received): $s_1^*$, $s_1$, $s_2$, $s_3$, $s_2$ (as used herein, an asterisk (*) next to a symbol may indicate the symbol being processed). Once the symbol stream is obtained, the processor may determine that $s_1$ has a rank of 1 (as shown in table 4 below) from the $L_{s2r}$. Since $L_{s2r}(s_1)=1$, $s_1$ has a "rank" of 1. Once a rank for $s_1$ is determined (or in some embodiments, independent of when the rank of $s_1$ is determined), the rank of $s_1$ is encoded with a binary code of: 10. As such, encoding the rank of the first obtained symbol, $s_1$ is determined by generating an associated binary code for the rank of the first obtained symbol. As shown in table 4, $s_1$ has a rank of 1 and a binary code of 10. After encoding the rank of the first obtained symbol, $s_1$, the frequency of $s_1$ is incremented in the histogram by 1, i.e. $H(s_1)=1$. That is to say, a new histogram frequency entry (or in some embodiments, simply an update histogram frequency entry) for the first obtained symbol, $s_1$, is generated by incrementing a histogram frequency entry of the first obtained symbol from the initial frequency shown in Table 4 to the updated frequency shown in Table 5.

At this point, a determination may be made, based on the new frequency entry of the first obtained symbol, if $s_1$ has constraint violation with a rank of a first violating symbol in $L_{s2r}$. As discussed earlier, a constraint violation occurs if $s_1$ of the plurality of symbols has a higher frequency than another symbol, in the histogram, but a larger rank in the $L_{s2r}$. Our search of the symbols in the $L_{s2r}$ shows that $s_1$ has rank 1, and that $s_0$ has a rank of 0 (as shown in table 4). In other words, the frequency of $s_0$ is 0, i.e. $H(s_0)=0$. As such, a constraint violation is determined to be present. That is to say, since symbol $s_1$ has a higher frequency than $s_0$, but it also has a larger rank than $s_0$, a constraint violation may be detected. Upon determination a constraint violation is present, the ranks of $s_1$ and $s_0$ in $L_{s2r}$ may be updated (e.g., an update may include swapping the ranks of $s_1$ and $s_0$, but is not limited to swapping). Correspondingly, the $L_{r2s}$ mappings for $s_1$ and $s_0$ should be updated as well. The updating process is simple:

$L_{s2renc}(s_1)=0$ and $L_{s2r}(s_0)=1$ $L_{r2s}(0)=s_1$ and $L_{r2sr}(1)=s_0$

The initial state of the symbols and the new state of the symbols after processing $s_1$ are shown in tables 4 and 5 below. Tables 6 through 8 illustrate the individual symbol to rank LUT, rank to symbol LUT and histogram after processing first symbol, $s_1$.

TABLE 4

Initial state of histogram and $L_{s2r}$

| Symbols | Histogram | Rank | Binary Codes |
|---|---|---|---|
| $s_0$ | 0 | 0 | 0 |
| $s_1$ | 0 | 1 | 10 |
| $s_2$ | 0 | 2 | 110 |
| $s_3$ | 0 | 3 | 111 |

TABLE 5

Updated statistics at the encoder after s1 is processed

| Symbols | Histogram | Rank | Codes |
|---|---|---|---|
| $s_0$ | 1 | 0 | 0 |
| $s_1$ | 0 | 1 | 10 |
| $s_2$ | 0 | 2 | 110 |
| $s_3$ | 0 | 3 | 111 |

TABLE 6

New state of $L_{s2r}$ at encoder

| Symbols | Rank |
|---|---|
| $s_0$ | 1 |
| $s_1$ | 0 |
| $s_2$ | 2 |
| $s_3$ | 3 |

TABLE 7

New state of $L_{r2s}$ at encoder

| Rank | Symbols |
|---|---|
| 0 | $s_1$ |
| 1 | $s_0$ |
| 2 | $s_2$ |
| 3 | $s_3$ |

TABLE 8

New histogram entry at the encoder

| 0 | 1 | 0 | 0 |
|---|---|---|---|
| $s_0$ | $s_1$ | $s_2$ | $s_3$ |

Consider the next symbol in the sequence $s_1$, $s_1^*$, $s_2$, $s_3$, $s_2$. As $L_{enc}(s_1)=0$, $s_1$ has rank of 0 now, as shown in Tables 5. This rank of 0 (and, therefore $s_1$) is encoded with a binary code of 0 as shown in Table 5. Importantly, in some embodiments, the rank to binary codes mapping does not change, only symbols to rank mapping changes. After encoding, the frequency of $s_1$ is incremented by 1, i.e. $H(s_1)=2$. Since $s_1$ has a rank 0 in $L_{s2r}$ there is no better rank (e.g., no constraint violation is present), and as such, no updating (e.g., swapping) is needed. As a result, $L_{s2r}$ and $L_{r2s}$ at the encoder side do not change.

The previous state and the new state after processing $s_1$ are shown in tables 9 and 10 below.

TABLE 9

Previous state, prior to processing second obtained symbol, $s_1$

| Symbols | Histogram | Rank | Codes |
|---|---|---|---|
| $s_1$ | 1 | 0 | 0 |
| $s_0$ | 0 | 1 | 10 |
| $s_2$ | 0 | 2 | 110 |
| $s_3$ | 0 | 3 | 111 |

TABLE 10

Updated statistics at the encoder after second obtained symbol, $s_1$ is processed

| Symbols | Histogram | Rank | Codes |
|---|---|---|---|
| $s_1$ | 2 | 0 | 0 |
| $s_0$ | 0 | 1 | 10 |
| $s_2$ | 0 | 2 | 110 |
| $s_3$ | 0 | 3 | 111 |

Consider next symbol (e.g., third obtained symbol) in the sequence $s_1$, $s_1$, $s_2$*, $s_3$, $s_2$. The ranking of $s_2$ is determined by checking $L_{s2r}$ in table 10. As $L_{s2r}(s_2)=2$, $s_2$ has a rank of 2. This rank (and therefore $s_2$) is encoded with a binary code 110, also shown in Table 10. After encoding the symbol $s_2$, the frequency of $s_2$ is incremented by 1, i.e. $H(s_2)=1$, as shown in Table 11. As $s_2$ has rank 2, we now begin a search to find the symbol that has a better rank, i.e. 1, using $L_{r2s}$ in Table 10.

As the $L_{s2r}(1)=s_0$, we know that $s_0$ has a rank of 1. Since the frequency of $s_0$ is 0, i.e. $H(s_0)=0$, a constraint violation is determined to be present (the exact details of the constraint violation have been described previously). That is to say, a constraint violation is determined to be present since symbol $s_2$ has a higher frequency than $s_0$ (a frequency of 1 as shown in table 12, updated state of $L_{s2r}$ after incrementing the frequency of $s_2$), but it has larger rank than $s_0$ (a rank of 2 as shown in table 11). To confirm, we check the next better rank, i.e. rank 0 for symbol $s_1$. However, since symbol $s_1$ has higher frequency than $s_2$ and a smaller rank than $s_2$, no violation is determined to be present. We go back to swapping $s_2$ and $s_0$. The rank swapping process is simple:

$L_{enc}(s_2)=1$ and $L_{enc}(s_0)=2$
$L_{dec}(1)=s_2$ and $L_{dec}(2)=s_0$

TABLE 11

The previous state before processing $s_2$

| Symbols | Histogram | Rank | Codes |
|---|---|---|---|
| $s_1$ | 2 | 0 | 0 |
| $s_0$ | 0 | 1 | 10 |
| $s_2$ | 0 | 2 | 110 |
| $s_3$ | 0 | 3 | 111 |

TABLE 12

Updated state of encoder

| Symbols | Histogram | Rank | Codes |
|---|---|---|---|
| $s_1$ | 2 | 0 | 0 |
| $s_2$ | 1 | 1 | 10 |
| $s_0$ | 0 | 2 | 110 |
| $s_3$ | 0 | 3 | 111 |

The updated $L_{s2r}$, $L_{r2s}$ and histogram at the encoder after processing $s_2$ are shown in tables 13-15.

TABLE 13

New state of $L_{enc}()$ at encoder

| Symbols | Rank |
|---|---|
| $s_0$ | 2 |
| $s_1$ | 0 |

TABLE 13-continued

New state of $L_{enc}()$ at encoder

| Symbols | Rank |
|---|---|
| $s_2$ | 1 |
| $s_3$ | 3 |

TABLE 14

New state of $L_{dec}()$ at encoder

| Rank | Symbols |
|---|---|
| 0 | $s_1$ |
| 1 | $s_2$ |
| 2 | $s_0$ |
| 3 | $s_3$ |

TABLE 15

New histogram H() at encoder

| 0 | 2 | 1 | 0 |
|---|---|---|---|
| $s_0$ | $s_1$ | $s_2$ | $s_3$ |

Consider next symbol in the sequence $s_1$, $s_1$, $s_2$, $s_3$*, $s_2$. As shown in Table 16 below, the rank of $s_3$ is determined to be 3. As such, the symbol $s_3$ is encoded by 111. The previous state and the new state after processing $s_3$ are shown. Since a constraint violation is determined to be present, the ranks of $s_3$ and $s_0$ are swapped.

TABLE 16

Previous state of encoder

| Symbols | Histogram | Rank | Codes |
|---|---|---|---|
| $s_1$ | 2 | 0 | 0 |
| $s_2$ | 1 | 1 | 10 |
| $s_0$ | 0 | 2 | 110 |
| $s_3$ | 0 | 3 | 111 |

TABLE 17

New state of encoder after $s_3$ is processed

| Symbols | Histogram | Rank | Codes |
|---|---|---|---|
| $s_1$ | 2 | 0 | 0 |
| $s_2$ | 1 | 1 | 10 |
| $s_3$ | 1 | 2 | 110 |
| $s_0$ | 0 | 3 | 111 |

Consider the next symbol in the sequence $s_1$, $s_1$, $s_2$, $s_3$, $s_2$. The symbol $s_2$ is determined to have a rank of 1 as shown in table 18 below. A similar process is followed as described previously for the previous symbols (e.g., $s_1$, $s_1$, $s_2$, $s_3$). As such, $s_2$ is encoded by 10. The previous state and the new state after processing $s_2$ are shown. No swapping is needed since no constraint violation is detected. Updated statistics at the encoder after $s_2$ is processed are shown in table 19 below.

TABLE 18

| Previous state of encoder | | | |
|---|---|---|---|
| Symbols | Histogram | Rank | Codes |
| $s_1$ | 2 | 0 | 0 |
| $s_2$ | 1 | 1 | 10 |
| $s_3$ | 1 | 2 | 110 |
| $s_0$ | 0 | 3 | 111 |

TABLE 19

| New state of encoder after $S_2$ is processed | | | |
|---|---|---|---|
| Symbols | Histogram | Rank | Codes |
| $s_1$ | 2 | 0 | 0 |
| $s_2$ | 2 | 1 | 10 |
| $s_3$ | 1 | 2 | 110 |
| $s_0$ | 0 | 3 | 111 |

As we have seen so far, the sequence is encoded by the following bits:

TABLE 20

| The sequence is encoded with these bits. | | | | |
|---|---|---|---|---|
| $s_1$ | $s_1$ | $s_2$ | $s_3$ | $s_2$ |
| 10 | 0 | 110 | 111 | 10 |

C. Decoder

At the decoder, the sequence of bits 10011011110 encoded at the encoder may be received. In some embodiments, the decoder starts with the same initialization process as described for the encoder, shown in Table 21 (reproduced below).

TABLE 21

| Initial state of encoder and decoder | | | |
|---|---|---|---|
| Symbols | Histogram | Rank | Codes |
| $s_0$ | 0 | 0 | 0 |
| $s_1$ | 0 | 1 | 10 |
| $s_2$ | 0 | 2 | 110 |
| $s_3$ | 0 | 3 | 111 |

As described previously, in some embodiments, $L_{s2r}$ maps symbols to their respective ranks, $L_{r2s}$ maps ranks back to their respective symbols and the decoder has a local copy of $L_{s2r}$ and $L_{r2s}$. For the initial state shown in Table 21, the look-up tables may read as follows:

TABLE 22

| Initial state of $L_{s2r}()$ at decoder | |
|---|---|
| Symbols | Rank |
| $s_0$ | 0 |
| $s_1$ | 1 |
| $s_2$ | 2 |
| $s_3$ | 3 |

TABLE 23

| Initial state of $L_{r2s}()$ at decoder | |
|---|---|
| Rank | Symbols |
| 0 | $s_0$ |
| 1 | $s_1$ |
| 2 | $s_2$ |
| 3 | $s_3$ |

TABLE 24

| Initial histogram H, at decoder | | | |
|---|---|---|---|
| 0 | 0 | 0 | 0 |
| $s_0$ | $s_1$ | $s_2$ | $s_3$ |

At the decoder, a compressed sequence of bits 10011011110 shown in Table 20 may be received. The compressed sequence of bits may be the bits generated at the encoder. From Table 20 it is clear that the first symbol is $s_1$: [10]011011110 (brackets are used herein to distinguish the binary code of the respective symbol). The mappings are updated in a similar manner as discussed for the encoder side. The reader can observe that these tables are in complete sync with the encoder $L_{s2r}$ and $L_{r2s}$ at this point in time.

TABLE 25

| Initial state of decoder | | | |
|---|---|---|---|
| Symbols | Histogram | Rank | Codes |
| $s_0$ | 0 | 0 | 0 |
| $s_1$ | 0 | 1 | 10 |
| $s_2$ | 0 | 2 | 110 |
| $s_3$ | 0 | 3 | 111 |

TABLE 26

| New state of decoder after $s_1$ is processed | | | |
|---|---|---|---|
| Symbols | Histogram | Rank | Codes |
| $s_1$ | 1 | 0 | 0 |
| $s_0$ | 0 | 1 | 10 |
| $s_2$ | 0 | 2 | 110 |
| $s_3$ | 0 | 3 | 111 |

As per Table 26, the next symbol in the sequence of bits 10[0]11011110 is $s_1$. The LUT mappings are not updated as there was no updating or swapping involved, as mentioned previously for the encoder side since no constraint violation is present.

TABLE 27

| Previous state of decoder | | | |
|---|---|---|---|
| Symbols | Histogram | Rank | Codes |
| $s_1$ | 1 | 0 | 0 |
| $s_0$ | 0 | 1 | 10 |
| $s_2$ | 0 | 2 | 110 |
| $s_3$ | 0 | 3 | 111 |

TABLE 28

New state of decoder after $s_1$ is processed

| Symbols | Histogram | Rank | Codes |
|---|---|---|---|
| $s_1$ | 2 | 0 | 0 |
| $s_0$ | 0 | 1 | 10 |
| $s_2$ | 0 | 2 | 110 |
| $s_3$ | 0 | 3 | 111 |

As per Table 28, the next symbol in the sequence of bits 100[110]11110 is $s_2$. The LUT mappings are updated as shown below. The process is similar to the encoder side. The reader can observe that these tables are in complete sync with the encoder at this point in time.

TABLE 29

Previous state of decoder

| Symbols | Histogram | Rank | Codes |
|---|---|---|---|
| $s_1$ | 2 | 0 | 0 |
| $s_0$ | 0 | 1 | 10 |
| $s_2$ | 0 | 2 | 110 |
| $s_3$ | 0 | 3 | 111 |

TABLE 30

New state of decoder after $s_2$ is processed

| Symbols | Histogram | Rank | Codes |
|---|---|---|---|
| $s_1$ | 2 | 0 | 0 |
| $s_2$ | 1 | 1 | 10 |
| $s_0$ | 0 | 2 | 110 |
| $s_3$ | 0 | 3 | 111 |

As per Table 30, the next symbol in the sequence of bits 100110[111]10 is $s_3$. The LUT mappings are updated as shown below. The details are excluded as the process has been previously described.

TABLE 31

Previous state of decoder

| Symbols | Histogram | Rank | Codes |
|---|---|---|---|
| $s_1$ | 2 | 0 | 0 |
| $s_2$ | 1 | 1 | 10 |
| $s_0$ | 0 | 2 | 110 |
| $s_3$ | 0 | 3 | 111 |

TABLE 32

New state of decoder after $s_3$ is processed

| Symbols | Histogram | Rank | Codes |
|---|---|---|---|
| $s_1$ | 2 | 0 | 0 |
| $s_2$ | 1 | 1 | 10 |
| $s_3$ | 1 | 2 | 110 |
| $s_0$ | 0 | 3 | 111 |

As per Table 32, the next symbol in the sequence of bits 100110111[10] is $s_2$. The LUT mappings are updated as shown below. The details are excluded as the process has been described previously.

TABLE 33

Previous state of decoder

| Symbols | Histogram | Rank | Codes |
|---|---|---|---|
| $s_1$ | 2 | 0 | 0 |
| $s_2$ | 1 | 1 | 10 |
| $s_3$ | 1 | 2 | 110 |
| $s_0$ | 0 | 3 | 111 |

TABLE 34

New state of decoder after $s_2$ is processed

| Symbols | Histogram | Rank | Codes |
|---|---|---|---|
| $s_1$ | 2 | 0 | 0 |
| $s_2$ | 2 | 1 | 10 |
| $s_3$ | 1 | 2 | 110 |
| $s_0$ | 0 | 3 | 111 |

As a result, the sequence of bits 10011011110 is decoded to get the following symbols (e.g., to be displayed, stored, transmitted) and an exact reconstruction at the decoder side may be achieved.

TABLE 35

The sequence is encoded with these bits.

| $s_1$ | $s_1$ | $s_2$ | $s_3$ | $s_2$ |
|---|---|---|---|---|
| 10 | 0 | 110 | 111 | 10 |

TABLE 36

An exact reconstruction at the decoder side is achieved.

| 10 | 0 | 110 | 111 | 10 |
|---|---|---|---|---|
| $s_1$ | $s_1$ | $s_2$ | $s_3$ | $s_2$ |

Figure 4:
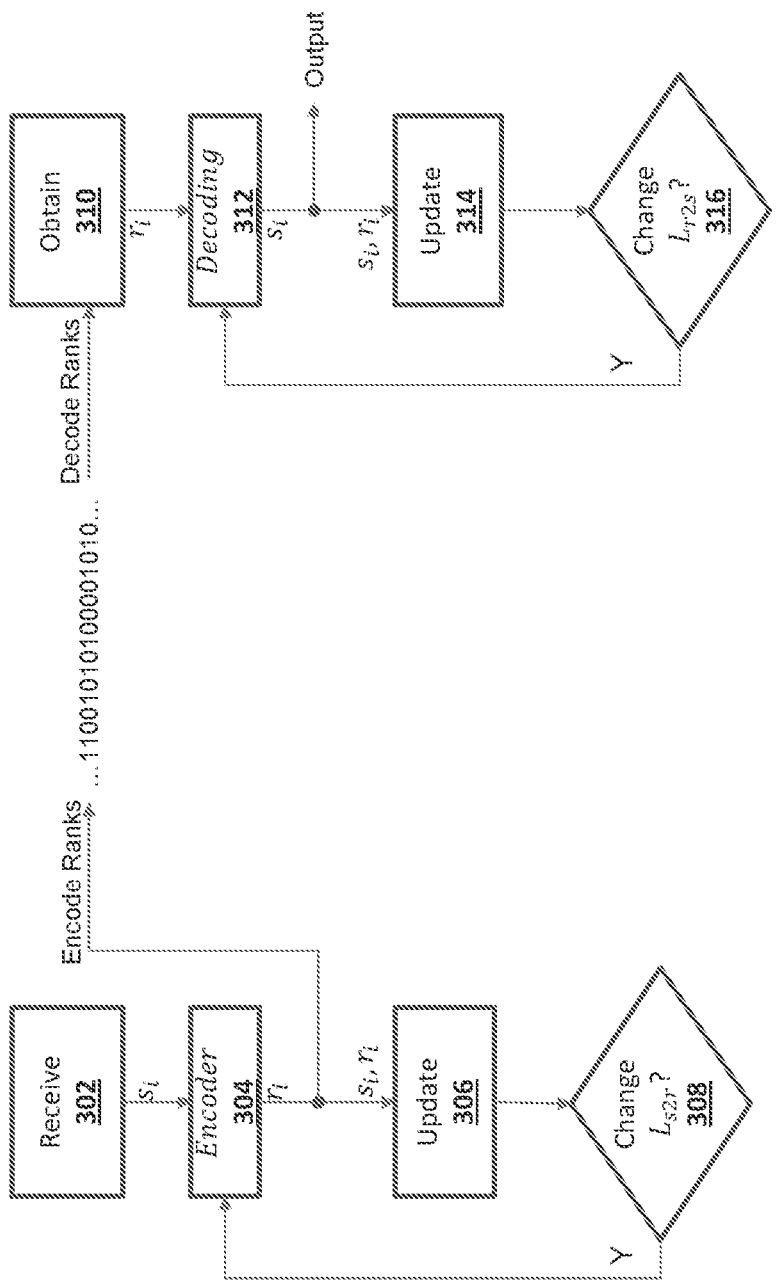
FIG. 4 is a logic diagram of dynamic symbol compression method, according to an exemplary embodiment.

FIG. 4 is a logic diagram of dynamic symbol compression method, in accordance with some embodiments.

At the encoder side, receiving module 302 includes obtaining a symbol stream comprising a plurality of incoming symbols. For example, as explained in reference to FIG. 3, symbols $s_1^*$, $s_1$, $s_2$, $s_3$, $s_2$ may be received. After determining a rank of a first obtained symbol, $s_i$, of the plurality of symbols from $L_{s2r}$, encoder module 304 includes encoding the rank of the first symbol. The details of this process have been described in reference to FIG. 3.

In some embodiments, update module 306 includes generating a new frequency entry for the first obtained symbol by incrementing an initial histogram frequency entry of the first obtained symbol after encoding a rank of the first obtained symbol. The details of this process have been described in reference to FIG. 3.

In some embodiments, determination module 308 includes determining based on the new frequency entry of the first obtained symbol, that the rank of the first obtained symbol of the plurality of symbols has a constraint violation with a rank of a first violating symbol in the first encoder LUT. If a constraint violation is determined to be present, the rank of the first obtained symbol and the rank of the first violating symbol in the first encoder LUT may be updated (e.g., swapped) so the constraint violation is resolved. Correspondingly, the $L_{r2s}$ should be updated to reflect the changes in the $L_{s2r}$. Accordingly, a compressed bit-stream may be generated by iteratively applying an encoding function to each symbol of the plurality of symbols.

At the decoder side, obtaining module 310 obtains a first sequence of bits of a compressed bit-stream (e.g., as shown in FIG. 4, . . . 11001010100001010). The details of this process have been described in reference to FIG. 3.

Next, decoding module 312 may include decoding a first obtained symbol (of a plurality of symbols) from a first binary code from the sequence of bits. The details of this process have been described in reference to FIG. 3.

In some embodiments, update module 314 may include incrementing a histogram frequency entry of the first obtained symbol after decoding the first obtained symbol.

Determining module 316 may include determining, based on the new frequency entry of the first obtained symbol, if the rank of the first obtained symbol of the plurality of symbols has a constraint violation with a rank of a first violating symbol in the first decoder LUT.

Based on the determination of determination module 316, the rank of the first obtained symbol and the rank of the first violating symbol in the first decoder LUT may be updated (e.g., swapped, incremented, etc.) so the constraint violation is resolved. Correspondingly, the $L_{r2s}$ should be updated to reflect the changes in $L_{s2r}$.

Through this process, a symbol stream (e.g., to be displayed, stored, transmitted) may be generated by iteratively applying a decoding function to each binary code from the sequence of bits.

Figure 5:
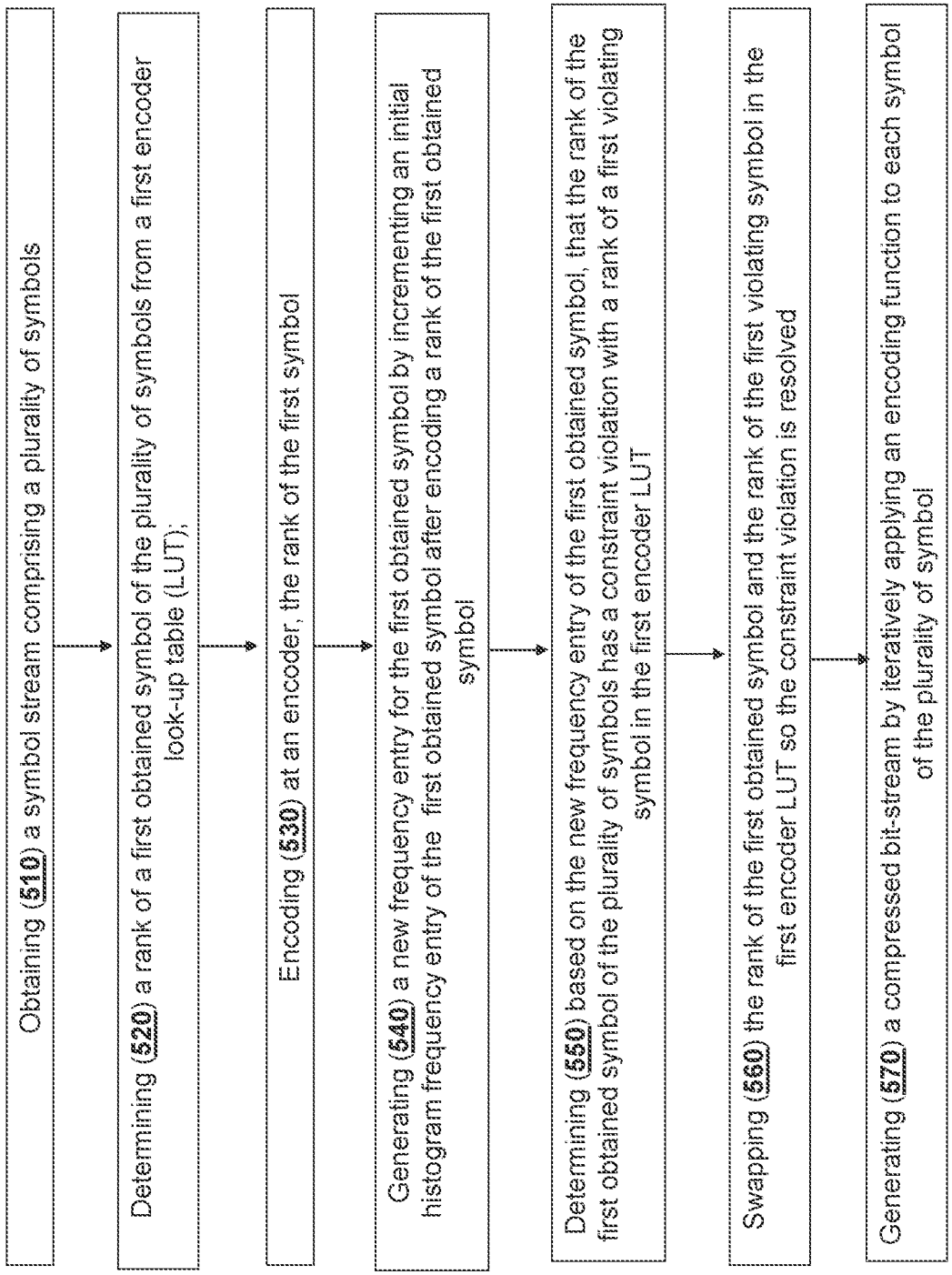
FIG. 5 is a flowchart of the dynamic symbol compression method, according to an exemplary embodiment.

FIG. 5 is a flowchart of encoding data for transmission from a source to a destination over a communication channel, in accordance with some embodiments.

The method 500 may be performed by at least one processor (e.g., processing unit 210 in FIG. 2). The method may include obtaining 510 a symbol stream comprising a plurality of symbols (e.g., plurality of symbols 202a-202h).

The method 500 may include determining 520 a rank of a first obtained symbol of the plurality of symbols from a first encoder look-up table (LUT). For example, the method 500 may include determining a rank of first obtained symbol 202a in FIG. 3.

The method 500 may include encoding 530 at an encoder (e.g., dynamic encoder 100), the rank of the first obtained symbol. For example, the method 500 may include encoding at dynamic encoder 100 the rank of first obtained symbol 202a.

In some embodiments, encoding the rank of the first obtained symbol is determined by generating an associated binary code for the rank of the first obtained symbol.

The method 500 may include generating 540 a new frequency entry for the first obtained symbol by incrementing an initial histogram frequency entry of the first obtained symbol after encoding the rank of the first obtained symbol.

In some embodiments, the first encoder LUT is initialized using the frequency distribution defined in the histogram.

In some embodiments, the first encoder LUT maps each symbol of the plurality of symbols to their rank, in which a symbol associated with a higher frequency in the histogram receives a smaller rank and a symbol associated with a lower frequency in the histogram receives a larger rank.

The method 500 may include determining 550 based on the new frequency entry of the first obtained symbol, that the rank of the first obtained symbol of the plurality of symbols has a constraint violation with a rank of a first violating symbol in the first encoder LUT.

In some embodiments, a constraint violation occurs if a symbol, $s_i$ of the plurality of symbols has a higher frequency than another symbol, $s_1$ in the histogram, but a larger rank in first encoder LUT, such that, the constraint violation is defined as: $H(s_i) < H(s_1)$ but $rank(r_1) > rank(s_1)$.

In some embodiments, when the constraint violation is not present: skipping any updates to the first encoder LUT and second encoder LUT for the first obtained symbol and the violating symbol and applying the encoding function to the second obtained symbol of the plurality of symbols.

The method 500 may include swapping 560 the rank of the first obtained symbol and the rank of the first violating symbol in the first encoder LUT so the constraint violation is resolved. In some embodiments, swapping the rank of the first obtained symbol and first violating symbol in the first encoder LUT and updating the corresponding second encoder LUT entries for the first obtained symbol and first violating symbol occurs without any additional data shared between the encoder and corresponding decoder, in which the first encoder LUT and second encoder LUT at the encoder are distinct from and also synchronized with the first decoder LUT and second decoder LUT at a corresponding decoder.

In some embodiments, the second encoder LUT is initialized from the first encoder LUT.

The method 500 may include generating 570 a compressed bit-stream by iteratively applying an encoding function to each symbol of the plurality of symbols.

In some embodiments, the method 500 further includes updating, a corresponding second encoder LUT for the first obtained symbol and first violating symbol, wherein the first encoder LUT is a symbol to rank LUT and wherein the second encoder LUT is a rank to symbol LUT.

In some embodiments iteratively applying the encoding function to each symbol of the plurality of symbols includes: a) determining a rank of the second obtained symbol of the plurality of symbols, b) encoding, at an encoder, the rank of the second obtained symbol of the plurality of symbols, c) generating a histogram frequency entry by incrementing a histogram frequency entry of the second obtained symbol after encoding the rank of the second obtained symbol, d) determining, based on the new frequency entry of the second obtained symbol, that the rank of the second symbol in the first encoder LUT has a constraint violation with a rank of a second violating symbol in the first encoder LUT of the plurality of symbols and f) swapping the rank of the second obtained symbol of the plurality of symbols and the rank of the second violating symbol in the first encoder LUT so the constraint violation is resolved.

In some embodiments, a histogram frequency entry of each symbol of the plurality of symbols represents the number of occurrences of that symbol in the symbol stream compressed so far.

Figure 6:
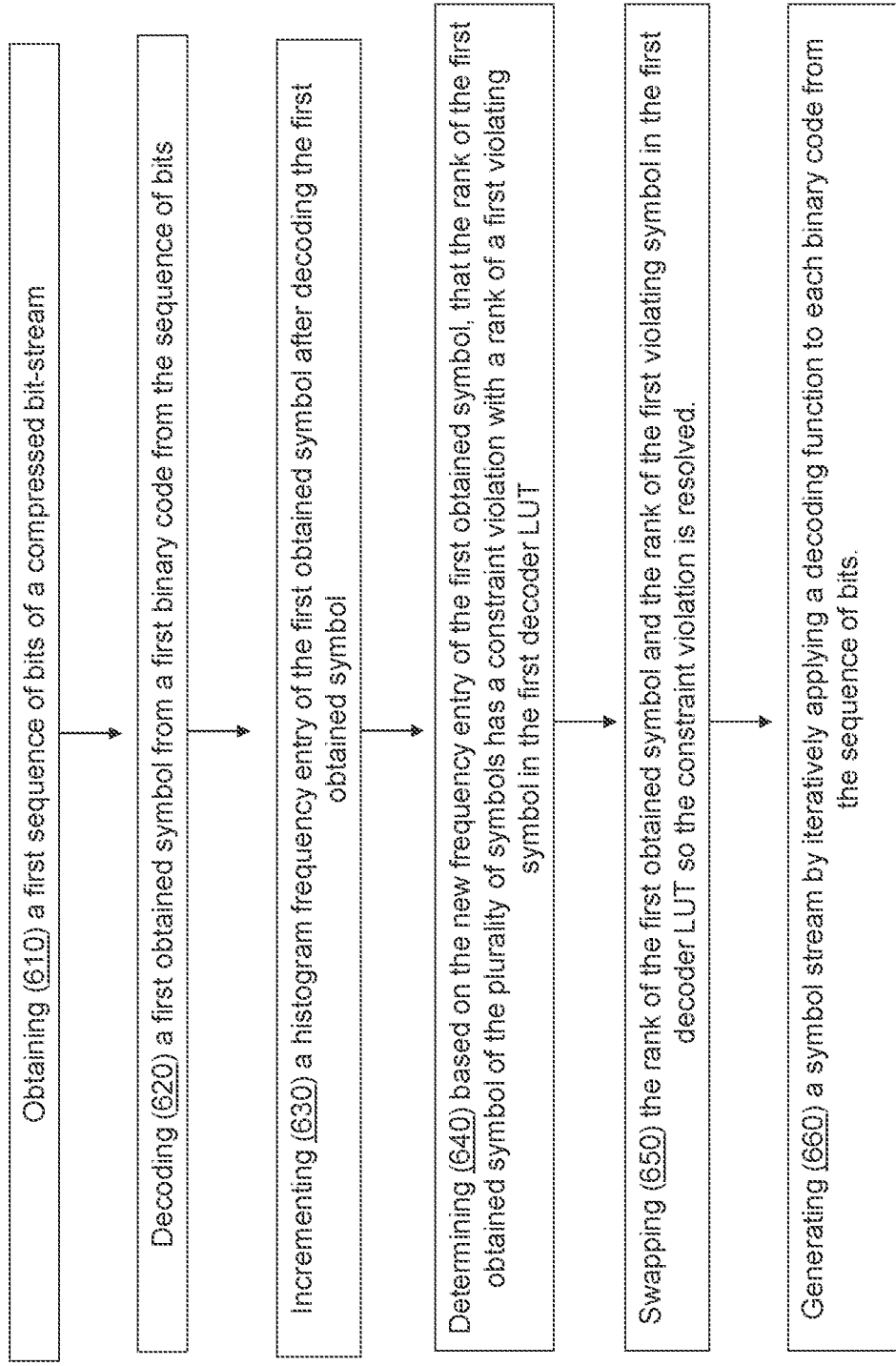
FIG. 6 is a flowchart for dynamically decoding a sequence of bits, according to an exemplary embodiment.

FIG. 6 is a method 600 of dynamically decoding a sequence of bits, in accordance with some embodiments.

The method 600 may include obtaining 610 a first sequence of bits of a compressed bit-stream.

The method 600 may also include decoding 620 first obtained symbol from a first binary code from the sequence of bits.

The method 600 may also include incrementing 630 a histogram frequency entry of the first obtained symbol after decoding the first obtained symbol.

The method 600 may also include determining 640 based on the new frequency entry of the first obtained symbol, that the rank of the first obtained symbol of the plurality of symbols has a constraint violation with a rank of a first violating symbol in the first decoder LUT.

The method 600 may also include swapping 650 the rank of the first obtained symbol and the rank of the first violating symbol in the first decoder LUT so the constraint violation is resolved.

In some embodiments, swapping 650 the rank of the first obtained symbol and first violating symbol in the first decoder LUT and updating the corresponding second decoder LUT entries for the first obtained symbol and first violating symbol occurs without any additional data shared between the decoder and corresponding encoder, and wherein the first decoder LUT and second decoder LUT at the decoder are distinct from and also synchronized with the first encoder LUT and second encoder LUT at a corresponding encoder.

The method 600 may also include generating 660 a symbol stream by iteratively applying a decoding function to each binary code from the sequence of bits.

The method 600 also includes updating a corresponding second LUT for the first obtained symbol and first violating symbol, wherein the first LUT is a symbol to rank LUT and wherein the second LUT is a rank to symbol LUT.

The method 600, in which when the constraint violation is not present also includes: skipping any updates to the first decoder LUT and second decoder LUT for the first obtained symbol and the violating symbol and applying the decoding function to the second obtained symbol of the plurality of symbols.

In some embodiments, iteratively applying the decoding function to each binary code from the sequence of bits includes: a) decoding a second obtained symbol from a second binary code from the sequence of bits, b) incrementing a histogram frequency entry of the second obtained symbol after decoding the second obtained symbol, c) determining, based on the new frequency entry of the second obtained symbol, that the rank of the second obtained symbol of the plurality of symbols has a constraint violation with a rank of a second violating symbol in the first decoder LUT, and d) swapping the rank of the second obtained symbol and the rank of the second violating symbol in the first decoder LUT so the constraint violation is resolved.

In some embodiments, a constraint violation occurs if a symbol, $s_i$ of the plurality of symbols has a higher frequency than another symbol, $s_1$ in the histogram, but a larger rank in first LUT, such that, the constraint violation is defined as: $H(s_1) < H(s_i)$ but rank $(s_i) >$ rank $(s_1)$.

In some embodiments, a histogram frequency entry of each symbol represents the number of occurrences of that symbol in the bit stream decompressed so far.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A method for encoding data for transmission from a source to a destination over a communication channel, the method being performed by at least one processor and comprising:
   a) obtaining a symbol stream comprising a plurality of symbols;
   b) determining a rank of a first obtained symbol of the plurality of symbols from a first encoder look-up table (LUT);

c) encoding, at an encoder, the rank of the first obtained symbol;
d) generating a new frequency entry for the first obtained symbol by incrementing an initial histogram frequency entry of the first obtained symbol after encoding the rank of the first obtained symbol;
e) determining, based on the new frequency entry of the first obtained symbol, whether the rank of the first obtained symbol of the plurality of symbols has a constraint violation with a rank of a first violating symbol in the first encoder LUT;
f) swapping the rank of the first obtained symbol and the rank of the first violating symbol in the first encoder LUT so the constraint violation is resolved; and
g) generating a compressed bit-stream by iteratively applying an encoding function to each symbol of the plurality of symbols.

2. The method of claim 1, further comprising:
updating, a corresponding second encoder LUT for the first obtained symbol and first violating symbol, wherein the first encoder LUT is a symbol to rank LUT and wherein the second encoder LUT is a rank to symbol LUT.

3. The method of claim 2, wherein:
swapping the rank of the first obtained symbol and first violating symbol in the first encoder LUT and updating the corresponding second encoder LUT entries for the first obtained symbol and first violating symbol occurs without any additional data shared between the encoder and corresponding decoder, and wherein the first encoder LUT and second encoder LUT at the encoder are distinct from and also synchronized with a first decoder LUT and second decoder LUT at a corresponding decoder.

4. The method of claim 1, wherein upon determining that a constraint violation is not present: skipping any updates to the first encoder LUT and second encoder LUT for the first obtained symbol and the first violating symbol and applying the encoding function to a second obtained symbol of the plurality of symbols.

5. The method of claim 4, wherein iteratively applying the encoding function to each symbol of the plurality of symbols includes:
a) determining a rank of the second obtained symbol of the plurality of symbols;
b) encoding, at an encoder, the rank of the second obtained symbol of the plurality of symbols;
c) generating a histogram frequency entry by incrementing a histogram frequency entry of the second obtained symbol after encoding the rank of the second obtained symbol;
d) determining, based on the new frequency entry of the second obtained symbol, that the rank of the second obtained symbol in the first encoder LUT has a constraint violation with a rank of a second violating symbol in the first encoder LUT of the plurality of symbols; and
e) swapping the rank of the second obtained symbol of the plurality of symbols and the rank of the second violating symbol in the first encoder LUT so the constraint violation is resolved.

6. The method of claim 1, wherein a constraint violation occurs if a symbol, $s_i$ of the plurality of symbols has a higher frequency than another symbol, sin the histogram, but a larger rank in first encoder LUT, such that, the constraint violation is defined as: $H(s_1) < H(s_i)$ but rank $(s_i) >$ rank $(s_1)$.

7. The method of claim 1, wherein encoding the rank of the first obtained symbol is determined by generating an associated binary code for the rank of the first obtained symbol.

8. The method of claim 1, wherein a histogram frequency entry of each symbol of the plurality of symbols represents a number of occurrences of that symbol in the symbol stream compressed so far.

9. The method of claim 1, wherein the first encoder LUT is initialized using a frequency distribution defined in the histogram.

10. The method of claim 1, wherein the first encoder LUT maps each symbol of the plurality of symbols to their rank and wherein a symbol associated with a higher frequency in the histogram receives a smaller rank and a symbol associated with a lower frequency in the histogram receives a larger rank.

11. The method of claim 2, wherein the second encoder LUT is initialized from the first encoder LUT.

12. A method of dynamically decoding a sequence of bits, the method comprising:
a) obtaining a first sequence of bits of a compressed bit-stream;
b) decoding a first obtained symbol from a first binary code from the sequence of bits;
c) incrementing a histogram frequency entry of the first obtained symbol after decoding the first obtained symbol;
d) determining, based on a new frequency entry of the first obtained symbol, whether a rank of the first obtained symbol of a plurality of symbols has a constraint violation with a rank of a first violating symbol in a first decoder LUT;
e) swapping the rank of the first obtained symbol and the rank of the first violating symbol in the first decoder LUT so the constraint violation is resolved; and
f) generating a symbol stream by iteratively applying a decoding function to each binary code from the sequence of bits.

13. The method of claim 12, further comprising:
updating a corresponding second LUT for the first obtained symbol and first violating symbol, wherein the first LUT is a symbol to rank LUT and wherein the second LUT is a rank to symbol LUT.

14. The method of claim 12, wherein:
swapping the rank of the first obtained symbol and first violating symbol in the first decoder LUT and updating the corresponding second decoder LUT entries for the first obtained symbol and first violating symbol occurs without any additional data shared between the decoder and corresponding encoder, and wherein the first decoder LUT and second decoder LUT at the decoder are distinct from and also synchronized with the first encoder LUT and second encoder LUT at a corresponding encoder.

15. The method of claim 12, wherein, upon determining that a constraint violation is not present:
skipping any updates to the first decoder LUT and second decoder LUT for the first obtained symbol and the first violating symbol and applying the decoding function to a second obtained symbol of the plurality of symbols.

16. The method of claim 12, wherein iteratively applying the decoding function to each binary code from the sequence of bits includes:
a) decoding a second obtained symbol from a second binary code from the sequence of bits;

b) incrementing a histogram frequency entry of the second obtained symbol after decoding the second obtained symbol;

c) determining, based on a new frequency entry of the second obtained symbol, that the rank of the second obtained symbol of the plurality of symbols has a constraint violation with a rank of a second violating symbol in the first decoder LUT; and d) swapping the rank of the second obtained symbol and the rank of the second violating symbol in the first decoder LUT so the constraint violation is resolved.

17. The method of claim 12, wherein a constraint violation occurs if a symbol, $s_i$ of the plurality of symbols has a higher frequency than another symbol, $s_1$ in the histogram, but a larger rank in first LUT, such that, the constraint violation is defined as: $H(s_1) < H(s_i)$ but rank $(s_i) >$ rank $(s_1)$.

18. The method of claim 1, wherein a histogram frequency entry of each symbol represents a number of occurrences of that symbol in a bit stream decompressed so far.

19. A decoder for decoding output symbols transmitted over a communications channel, the decoder comprising:
   a) obtaining a first sequence of bits of a compressed bit-stream;
   b) decoding a first obtained symbol from a first binary code from the first sequence of bits;
   c) incrementing a histogram frequency entry of the first obtained symbol after decoding the first obtained symbol;
   d) determining, based on a new frequency entry of the first obtained symbol, whether a rank of the first obtained symbol of a plurality of symbols has a constraint violation with a rank of a first violating symbol in a first decoder LUT;
   e) swapping the rank of the first obtained symbol and the rank of the first violating symbol in the first decoder LUT so the constraint violation is resolved; and
   f) generating a symbol stream by iteratively applying a decoding function to each binary code from the first sequence of bits.

20. An encoder for encoding data for transmission from a source to a destination over a communications channel, the encoder comprising:
   a) obtaining a symbol stream comprising a plurality of symbols;
   b) determining a rank of a first obtained symbol of the plurality of symbols from a first encoder look-up table (LUT);
   c) encoding, at an encoder, the rank of the first obtained symbol;
   d) generating a new frequency entry for the first obtained symbol by incrementing an initial histogram frequency entry of a first obtained symbol after encoding a rank of the first obtained symbol;
   e) determining, based on the new frequency entry of the first obtained symbol, whether the rank of the first obtained symbol of the plurality of symbols has a constraint violation with a rank of a first violating symbol in the first encoder LUT;
   f) swapping the rank of the first obtained symbol and the rank of the first violating symbol in the first encoder LUT so the constraint violation is resolved; and
   g) generating a compressed bit-stream by iteratively applying an encoding function to each symbol of the plurality of symbols.

* * * * *

UNITED STATES PATENT AND TRADEMARK OFFICE
CERTIFICATE OF CORRECTION

PATENT NO. : 12,348,600 B2
APPLICATION NO. : 17/971344
DATED : July 1, 2025
INVENTOR(S) : Harshad Kadu It is certified that error appears in the above-identified patent and that said Letters Patent is hereby corrected as shown below:

In the Claims

In Column 25, Line 65, in Claim 6, delete "sin" and insert -- $s_1$ in --.

In Column 25, Line 67, in Claim 6, delete "H ($s_1$)<H ($s_i$)" and insert -- $H(s_1) < H(s_i)$ --.

In Column 25, Line 67, in Claim 6, delete "rank ($s_i$)>rank ($s_1$)." and insert -- $rank(s_i) > rank(s_1)$. --.

In Column 27, Line 16, in Claim 17, delete "H ($s_1$)<H ($s_i$)" and insert -- $H(s_1) < H(s_i)$ --.

In Column 27, Line 16, in Claim 17, delete "rank ($s_i$)>rank ($s_1$)." and insert -- $rank(s_i) > rank(s_1)$. --.

Signed and Sealed this
Eleventh Day of November, 2025

John A. Squires
*Director of the United States Patent and Trademark Office*